United States Patent [19]

McAdams

[11] Patent Number: 5,034,623
[45] Date of Patent: Jul. 23, 1991

[54] LOW POWER, TTL LEVEL CMOS INPUT BUFFER WITH HYSTERESIS

[75] Inventor: Hugh P. McAdams, Houston, Tex.

[73] Assignee: Texas Instruments Incorporated, Dallas, Tex.

[21] Appl. No.: 458,210

[22] Filed: Dec. 28, 1989

[51] Int. Cl.⁵ .......................................... H03K 19/094
[52] U.S. Cl. .................... 307/290; 307/451; 307/475; 307/279
[58] Field of Search ............... 307/443, 451, 475, 359, 307/279, 290

[56] References Cited

U.S. PATENT DOCUMENTS

| | | | |
|---|---|---|---|
| 4,464,587 | 8/1984 | Suzuki et al. | 307/290 X |
| 4,563,594 | 1/1986 | Koyama | 307/443 X |
| 4,563,595 | 1/1986 | Bose | 307/290 |
| 4,779,015 | 10/1988 | Erdelyi | 307/475 |
| 4,786,830 | 11/1988 | Foss | 307/451 X |
| 4,825,106 | 4/1989 | Tipon et al. | 307/443 X |
| 4,849,653 | 7/1989 | Imai et al. | 307/290 |
| 4,859,873 | 8/1989 | O'Shaughnessy et al. | 307/290 |

Primary Examiner—David Hudspeth
Attorney, Agent, or Firm—Robby T. Holland; Thomas W. DeMond; Melvin Sharp

[57] ABSTRACT

A circuit for use as a TTL level CMOS input buffer with hysteresis is disclosed. A first transistor of a first conductivity tupe has its source connected to a first reference voltage. Second and third transistors of opposite conductivity type have their source drain paths connected in series between the drain of the first transistor and a common potential. The gates of the first, second, and third transistors are connected to an input signal. An inverter has its input connected to the drain of the first transistor and has an output. A fourth transistor of the first conductivity type has its gate connected to the output, its drain connected to the series connection between the second and third transistors, and its source connected to a second reference voltage. By appropriately sizing the transistors, the low level trip point and the high level trip point of the circuit may be adjusted. The circuit draws low power during standby. Logic gates may also be designed that incorporate the circuit.

28 Claims, 10 Drawing Sheets

LOW POWER, TTL LEVEL CMOS INPUT BUFFER WITH HYSTERESIS

FIELD OF THE INVENTION

The invention is related to semiconductor integrated circuits and more particularly to input buffer circuits of the type used in CMOS semiconductor memory devices.

BACKGROUND OF THE INVENTION

Dynamic random access memories (DRAMs) may be generally constructed as shown in U.S. Pat. No. 4,081,701 (a 16 kbit (DRAM) issued to White, McAdams and Redwine and assigned to Texas Instruments, Inc., and in U S. Pat. No. 4,239,993 (a 64 kbit DRAM) issued to McAlexander, White and Rao and assigned to Texas Instruments, Inc.

Complementary-metal-oxide (CMOS) semiconductor technology has been incorporated into the design of peripheral circuits for DRAMs. For example, U.S. Pat. No. 4,555,777 issued to Poteet and assigned to Texas Instruments, Inc. discloses DRAMs containing CMOS sense amplifiers. Among other advantages, CMOS technology aids in reducing the power consumed by the DRAM device.

An important consideration in the overall design of a memory system is the standby current drawn by a DRAM while it is inactive, since to a large degree this parameter determines the power consumed by the memory system. A significant portion of the standby current drawn by the DRAM comes from its first inverter connected to the Row Address Strobe (RAS) input. This inverter is required to be active (i.e., powered up) at all times in order to respond to a RAS signal that initiates a cycle and when the system wants to refresh the dynamically stored data. However, with a voltage supply typically of 5 v and transistor-transistor-logic (TTL) input signal levels (where typically 0.8 v is a "low" signal and 2.4 v is a "high" signal), CMOS input buffers consume current while in standby because the TTL "high" level input is not sufficient to turn the top p-channel transistor of its first CMOS inverter completely off. This allows a DRAM to consume power while in standby through a DC current path existing through the source/drain paths of the p-channel and n-channel transistors of the CMOS inverter of the input buffer.

Another important consideration in system design is the current consumed by a DRAM during initial power up before stable input voltage levels can be guaranteed. This problem occurs when the RAS input is at a level between the specified logic "low" and the specified logic "high". Between these levels, the input buffer may oscillate due to the RAS input fluctuating above and below the trip point of the first inverter of the input buffer. The trip point of the inverter is the level of voltage between the specified logic "low" and the specified logic "high" at which its p-channel transistor and its n-channel transistor switch. As RAS varies above and below this voltage level, the inverter accordingly varies as its transistors repeatedly switch on and off. This can cause the DRAM to go into oscillation that causes a large current drain on the external power supply. When this current drain is multiplied by the typically large number of memory chips located in a memory system, oscillation can load the system power supply and prevent it from coming up to the required voltage level in time.

It is an object of this invention to provide an input buffer that reduces the standby current drawn by a DRAM.

It is a further object of this invention to provide an input buffer that reduces DRAM oscillation.

Other objects and benefits of this invention will be apparent to those skilled in the art, based upon the description to follow herein.

SUMMARY OF THE INVENTION

A circuit for use as a TTL level CMOS input buffer with hysteresis is disclosed. A first transistor of a first conductivity type has its source connected to a first reference voltage. Second and third transistors of opposite conductivity type have their source/drain paths connected in series between the drain of the first transistor and a common potential. The gates of the first, second, and third transistors are connected to an input signal. An inverter has its input connected to the drain of the first transistor and has an output. A fourth transistor of the first conductivity type has its gate connected to the output, its drain connecetd to the series connection between the second and third transistors, and its source connected to a second reference voltage. By appropriately sizing the transistors, the low level trip point and the high level trip point of the circuit may be adjusted. The circuit draws low power during standby. Logic gates may also be designed that incorporate the circuit.

BRIEF DESCRIPTION OF THE DRAWINGS

The novel features believed characteristic of the invention are set forth in the appended claims. The invention itself, however, as well as other features and advantages thereof, will be best understood by reference to the detailed description that follows, wherein:

Corresponding numerals refer to corresponding parts in the figures unless the context otherwise indicates.

DETAILED DESCRIPTION OF SPECIFIC EMBODIMENT

Figure 1:
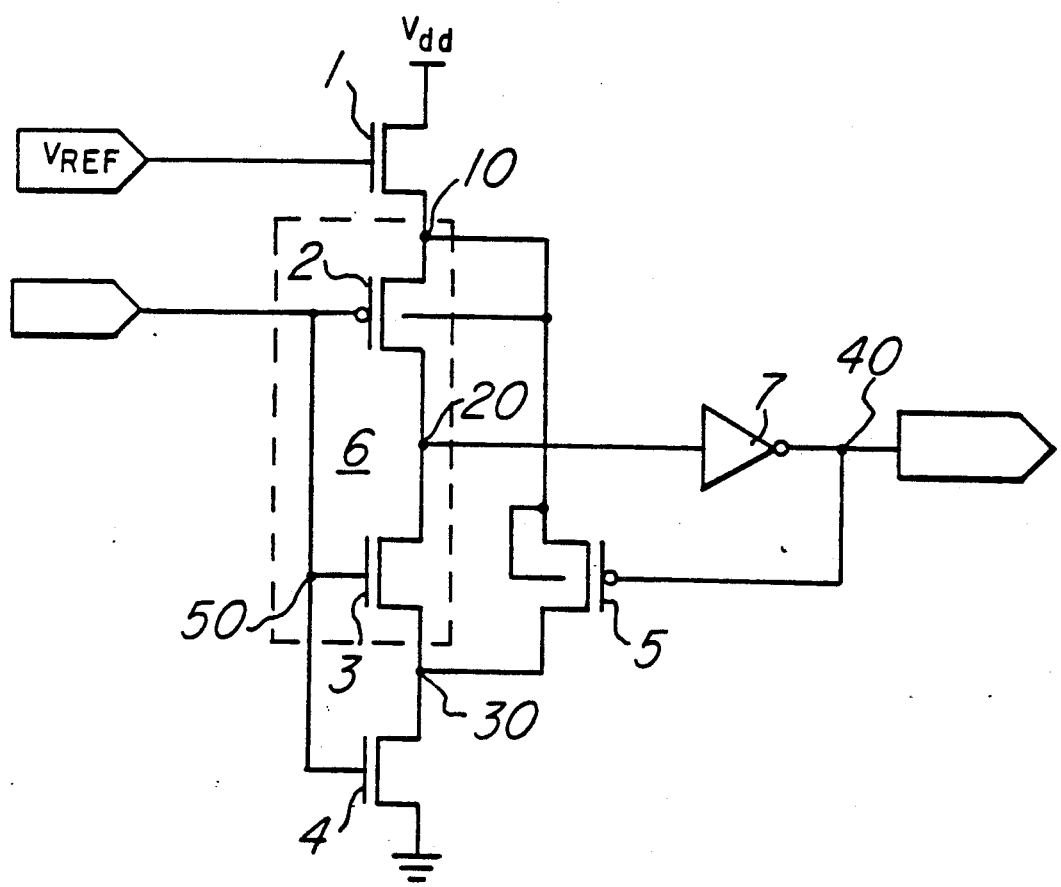
FIG. 1 is an electrical schematic diagram of the CMOS input circuit according to the invention.

Referring to FIG. 1, a low power, TTL level CMOS input buffer with hysteresis according to the invention is disclosed that receives an input signal Vin and is responsive to yield an output signal Vout.

In FIG. 1, a CMOS inverter 6 is formed of a p-channel transistor 2 and an n-channel transistor 3 having their gates connected together at a node 50 and their drains connected together at a node 20. An n-channel pull-up transistor 1 has its drain connected to a voltage supply Vdd, its gate connected to a voltage source Vref and its source connected to the source of p-channel transistor 2 at a node 10. The substrate of p-channel transistor 2 is also connected to node 10. Voltage supply Vdd is typically positive voltage such as +5 v supplied by an external voltage supply source. However, Vdd may vary as is later explained. Voltage supply Vref is a stable steady voltage source. It may be produced by any manner that yields a stable steady voltage. One way to produce Vref, for instance, is by means of a bandgap reference generator located on the DRAM chip. For the operation of the circuit of FIG. 1 described herein, Vref has a value of positive 3.3 v, however, the circuit of FIG. 1 advantageously accommodates other values for Vref as is later explained.

In the circuit of FIG. 1, also connected to node 50 is an input signal Vin and the gate of an n-channel pull down transistor 4. Input signal Vin functions as the input signal to the circuit shown in FIG. 1 and may be, for example, the Row Address Strobe (RAS) signal. The source of n-channel pull down transistor 4 is connected to ground and its drain is connected to the source of n-channel transistor 3 of CMOS inverter 6 at a node 30.

In FIG. 1, an inverter 7 with its input connected to node 20 yields the output signal Vout at node 40. Connected to node 40 is the gate of a p-channel transistor 5. P-channel transistor 5 has both its source and its substrate connected to node 10 and provides feedback from node 40 to node 30 where its drain is connected.

The required range of Vref to insure that the circuit of FIG. 1 operates properly as a low power input buffer within TTL levels (wherein typically 0.8 v is a logic "low" signal and 2.4 v is a logic "high" signal) during standby is found from the following relationships:

(1) $Vref - Vtn(1) > $ switching point of inverter 7
(2) $Vref - Vtn(1) - Vinh < Vtp(2)$ where Vtn(1) denotes the threshold voltage of n-channel pull-up transistor 1, Vtp(2) denotes the absolute value of the threshold voltage of p-channel transistor 2 of CMOS inverter 6, and Vinh denotes the minimum "high" level of Vin. In modern CMOS integrated circuits, such as in high density DRAMs, a typical Vtn(1) is about 1.0 v and a typical Vtp(2) is about 0.8–1.2 v. Vref may range between about 3.0 v and 3.8 v while satisfying the constraints of (1) and (2) above for Vinh as low as 2.0 v.

Vdd, as supplied by an external power supply source, often varies to some degree. For example, the specifications of modern DRAMs allow for plus or minus 10% margin on Vdd. In addition, the operation of the DRAM also generates noise on Vdd. The circuit of FIG. 1 advantageously yields output signal Vout within acceptable TTL range as Vdd varies from about 4.0 v to 6.0 v. As Vdd varies, n-channel pull-up transistor 1, connected as a source follower, causes the voltage at node 10 to remain essentially constant at $Vref - Vtn(1)$. Stability of the input switching levels, relative to a wide variation in Vdd, advantageously occurs from the connection of the sources and substrates of p-channel transistors 2 and 5 to node 10 that maintains a stable level.

Through the addition of n-channel pull down transistor 4 and p-channel transistor 5, oscillation is advantageously controlled in FIG. 1 through the addition of hysteresis. The addition of hysteresis advantageously allows the input circuit of FIG. 1 to react to an expanded TTL input signal range, while yielding an acceptable TTL output signal.

Figure 2:
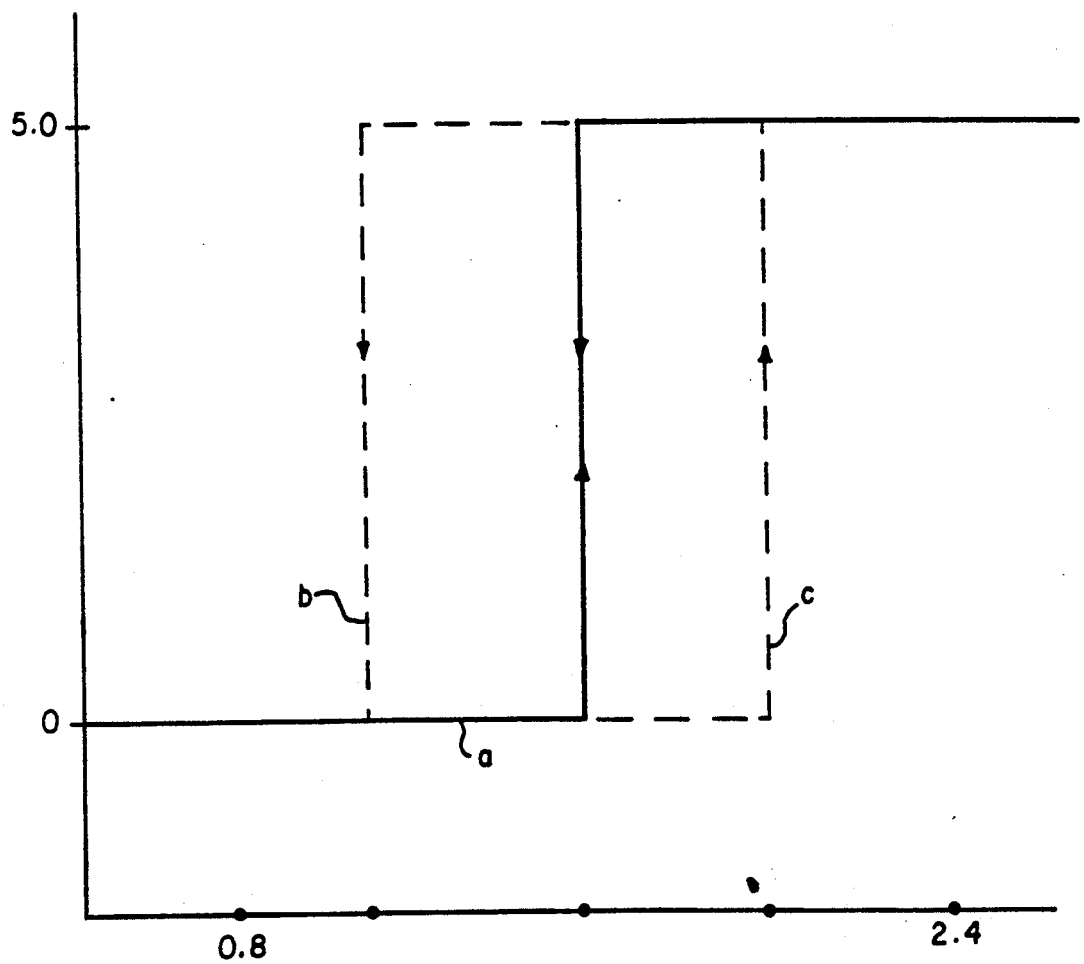
FIG. 2 is a graph illustrating hysteresis in the low level trip point and the high level trip point of the CMOS input circuit according to the invention.

FIG. 2 is a graph of input signal Vin and output signal Vout illustrating the addition of hysteresis in the input of FIG. 1. Solid line a illustrates a typical CMOS inverter with a single trip point, Vtrip. Vtrip is the switching point where a typical CMOS inverter switches as Vin goes high to low or low to high. Oscillation occurs in the typical CMOS inverter because Vin is typically not stable as Vdd fluctuates. As Vin varies slightly above and below Vtrip, the typical CMOS inverter constantly switches in response thereto thus casuing oscillation. In dashed line b, the high to low level switch point of the input of FIG. 1 is moved to the left of Vtrip. The circuit now switches at Vhltrip during the high to low trnsition of Vin rather than at Vtrip. In dashed line c, the low to high level switch point of the input of FIG. 1 is moved to the right of Vtrip. The circuit now switches at Vlhtrip during the low to high transition of Vin rather than at Vtrip. Hysteresis results by separating Vhltrip and Vlhtrip. The circuit of FIG. 1 has 2 switching points, a low level switching point and a high level switching point. The addition of hysteresis moves the low level switching point closer to the TTL "low" level of 0.8 v. The addition of hysteresis moves the high level switching point closer to the TTL "high" of 2.4 v. Oscillation is reduced because variations of Vin are handled so that larger variations are needed to cause switching.

The low level trip point and the high level trip point of inverter 6 of FIG. 1 is governed by the relative sizing of the widths and lengths of transistors 2, 3, 4, and 5. By appropriately sizing the widths and lengths, these transistors are advantageously set to switch on and off at different voltage levels. The low level trip point of inverter 6 is controlled by the relative sizing of p-channel transistor 2 and n-channel transistors 3 and 4. The high level trip point of inverter 6 is controlled by the relative sizing of n-channel pull-down transistor 4 and p-channel transistor 5. To a smaller degree, the relative sizing of p-channel transistor 2 and n-channel 3 of inverter 6 also play a role in controlling the high level trip point.

Figure 3:
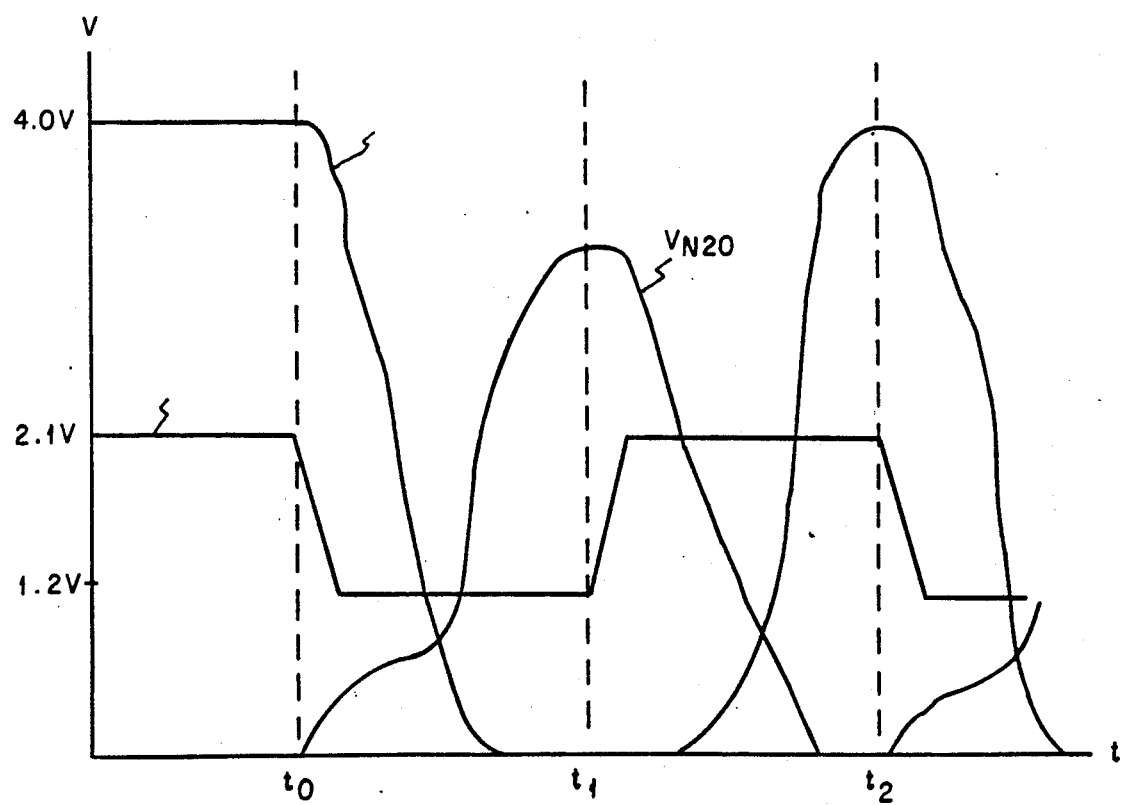
FIG. 3 is a timing diagram for the circuit of FIG. 1 showing signal voltages at various nodes as a function of time with Vdd at 4.0 v.

The operation of the input circuit shown in FIG. 1 has been simulated and will now be described in detail. Referring to FIG. 3, a timing diagram of the circuit of FIG. 1 is illustrated with the temperature equaling 100° C., Vdd equaling 4.0 v, Vref equaling 3.3 v, input signal Vin varying from 1.2 v to 2.1 v and the circuit elements of FIG. 1 having the following values:

| | | | |
|---|---|---|---|
| n-channel pull-up transistor 1 | width = | 30 | microns; |
| | length = | 0.8 | microns; |
| p-channel transistor 2 | width = | 05 | microns; |
| | length = | 0.8 | microns; |
| n-channel transistor 3 | width = | 05 | microns; |
| | length = | 01.2 | microns; |
| n-channel pull-down transistor 4 | width = | 05 | microns; |
| | length = | 01.2 | microns; |
| p-channel transistor 5 | width = | 12 | microns; |
| | length = | 01.2 | microns; |
| inverter 7 (p-channel transistor) | width = | 10 | microns; |
| | length = | 0.8 | microns; |
| (n-channel transistor) | width = | 30 | microns; |
| | length = | 0.8 | microns. |

With the above width to length ratios, it is seen that n-channel transistors 3 and 4 are smaller than p-channel transistors 2 and 5. The low level trip point of inverter 6 is about 1.2 v and the high level trip point of inverter 6 is about 2.0 v. Input Signal Vin and output signal Vout, and Vn20 (the voltage at node 20) are illustrated in FIG. 3. Previous to time t0, input signal Vin is "high", at 2.1 v. P-channel transistor 2 is off and n-channel transistor 3 is on. N-channel pull-down transistor 4 is also on. Vn20 is pulled "low" through the source-/drain paths of n-channel transistor 3 and n-channel pull-down transistor 4. Vn20 is complemented by inverter 7 to yield a "high" output signal Vout at node 40 of 4.0 v. N-channel pull-up transistor 1 remains on at all times, pulling the voltage at node 10 high to a level of Vref−Vtn(1). P-channel transistor 5 has output signal Vout "high" applied at its gate and is therefore off.

In FIG. 3, at time t0, a "high" to "low" transition occurs. Input signal Vin drops "low" to a level of 1.2 v. The impedance of N-channel transistor 4 rises and allows P-channel transistor 2 to control node 20. P-channel transistor 2 of inverter 6 turns on, the absolute value of the voltage level on its gate now greater than the threshold voltage of P-channel transistor 2. The voltage at node 20 rapidly rises towards the voltage at node 10. Inverter 7 complements the voltage at node 20 as it rises so output signal Vout goes "low". P-channel transistor 5 provides feedback from node 40 to node 30. As output signal Vout goes "low", once the gate to source voltage of p-channel transistor 5 rises above its threshold voltage, p-channel transistor 5 turns on and allows node 30 to rise towards the voltage at node 10. As node 30 rises, transistor 3 will turn off as input signal Vin drops below Vn20. (For n-channel transistor 3 to be on, its gate voltage must be a threshold voltage above its source voltage.)

In FIG. 3, at time t1, a "low" to "high" transition occurs. Input signal Vin goes "high" to a level of 2.1 v. P-channel transistor 2 turns off, n-channel pull down transistor 4 turns on and pulls the voltage at node 30 down. Once the voltage at node 30 becomes a threshold voltage less than input signal Vin, n-channel transistor 3 begins th pull the voltage at node 20 down. The voltage at node 20 is complemented by inverter 7. As output signal Vout rises, transistor 5 turns off and n-channel pull down transistor 4 is better able to pull the voltages at nodes 30 and 20 low.

Figure 4:
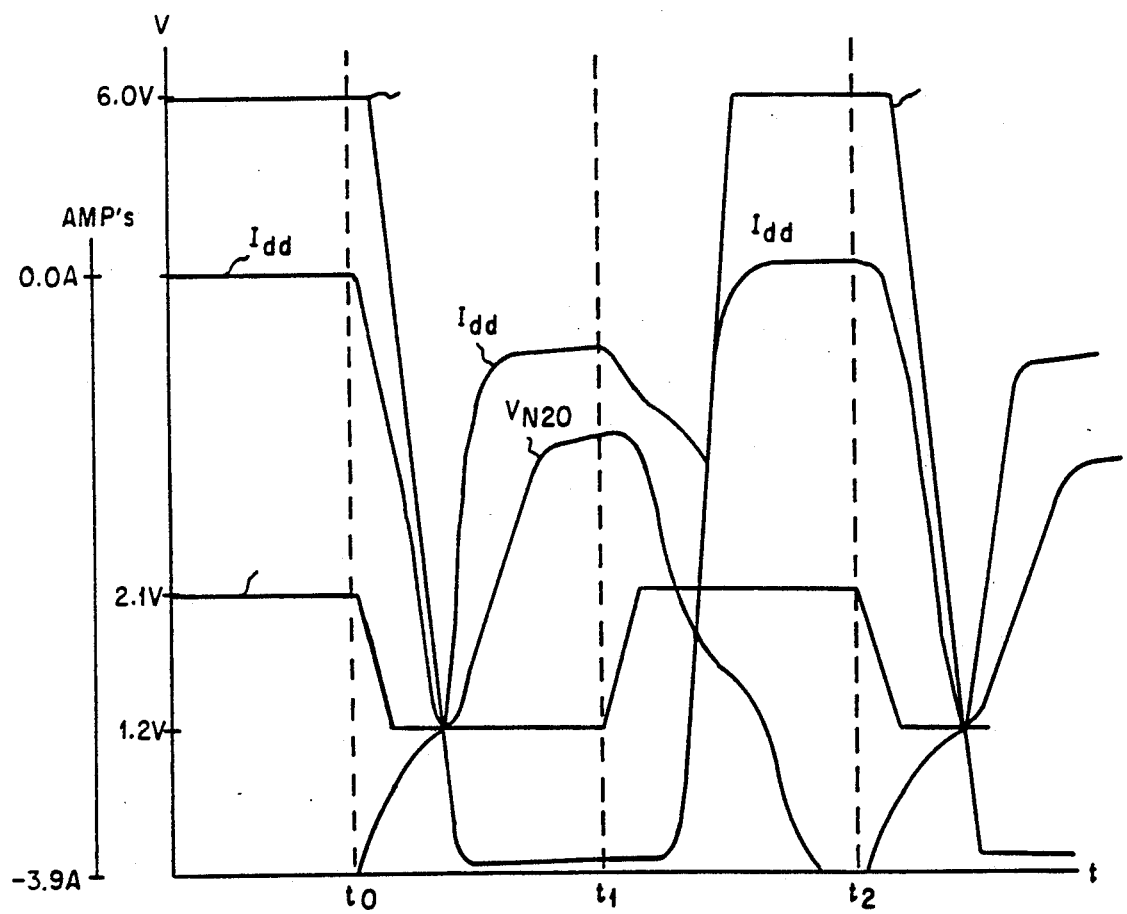
FIG. 4 is a timing diagram for the circuit of FIG. 1 showing power consumption as a function of time with Vdd at 6.0 v.

FIG. 4 is a timing diagram of the input circuit of FIG. 1 illustrating the low power it consumes. Vdd is now increased to 6.0 v in this simulation. All other parameters have the same values as those in the example of FIG. 3 above explained. Voltage is shown on the solid vertical axis. Amperage is shown on the segmented vertical axis. By comparing FIG. 4 with FIG. 3, as explained above, Vn20 rises to the same level as in FIG. 3 although Vdd is substantially increased. Vout now rises to a "high" level signal of 6.0 v. When Vout is "high", Idd is essentially 0 mA. When Vout is "low", Idd is approximately −0.6 mA. The power drawn by the circuit during standby is very low.

Figure 5:
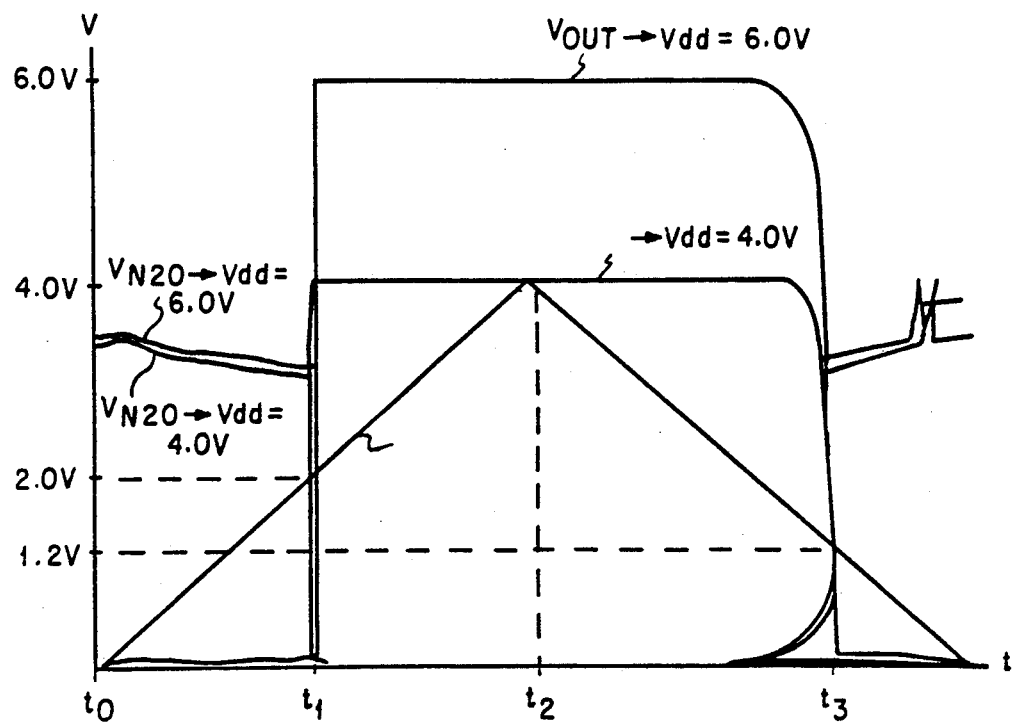
FIG. 5 is a timing diagram for the circuit of FIG. 1 showing slow ramp input signal transient analysis with temperature at 100° C.

FIG. 5 is a timing diagram for the input circuit of FIG. 1 showing scan range input signal transient analysis. In this simulation, input signal Vin slowly ramps upward from 0 v at t0 to 4 v at t2. At t1, with Vin having a value of about 2.1 v, the circuit recognizes input signal Vin as being "high". The "high" level trip point of inverter 6 is reached, n-channel transistors 3 and 4 are on and Vn20 drops to 0 v. Output signal Vout rises to 4.0 v with Vdd of 4.0 v, or to 6.0 v, with Vdd of 6.0 v. At t2, input signal Vin begins to decline. Output signal Vout remains "high" until input signal Vin drops to the "low" level trip point of inverter 6 of about 1.2 v. P-channel transistor 6 turns on, n-channel transistors 3 and 4 turn off, and Vn20 rises. Output signal Vout drops low to 0 v.

Figure 6:
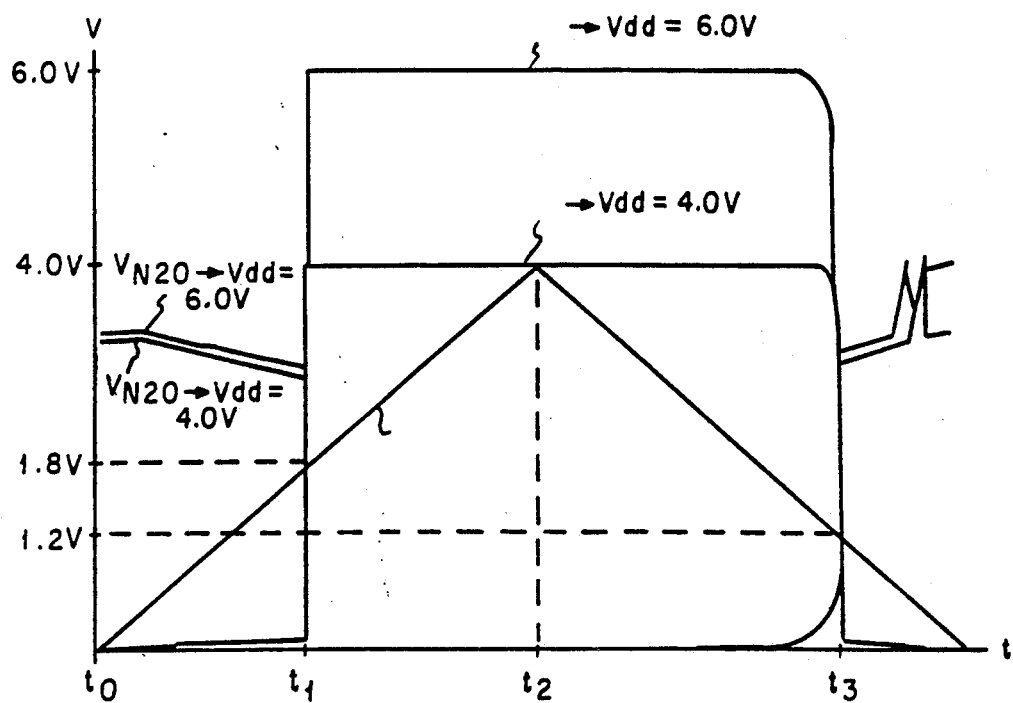
FIG. 6 is a timing diagram for the circuit of FIG. 1 showing slow ramp input signal transient analysis with temperature at 0° C.

FIG. 6 is a timing diagram for the input circuit of FIG. 1 showing scan range input signal transient analysis with a temperature of 0° C. By comparing FIG. 6 with FIG. 5, it is seen that the hysteresis in this simulation increases when the circuit operates at the lower temperature. The "high" level switch point of inverter 6 is at about 1.8 v rather than 2.0 v.

Figure 7:
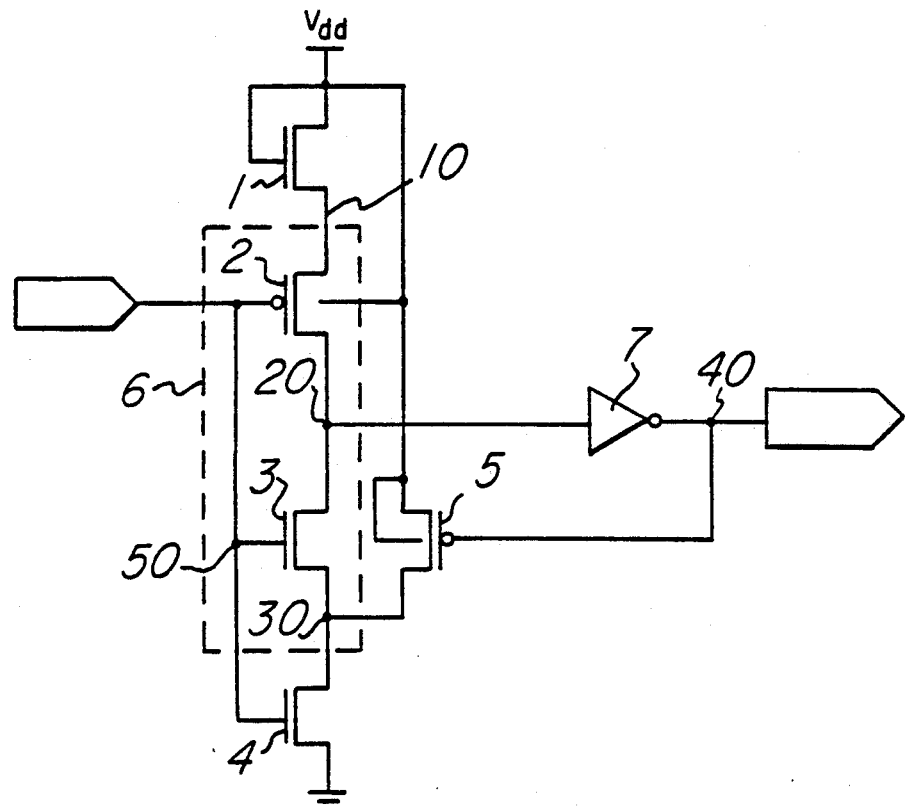
FIG. 7 is an electrical schematic diagram of an alternative embodiment of the invention illustrating a single supply source for biasing node 10.

FIG. 7 is an electrical schematic diagram illustrating an alternative embodiment of the invention wherein FIG. 1 is modified so that Vdd now supplies the gate of n-channel pull up transistor 1 in place of Vref. This embodiment is advantageous for situations wherein a stable reference voltage is not available. This circuit operates as above described except that the voltage at node 10 is not as steady and will now vary as Vdd fluctuates.

Figure 8:
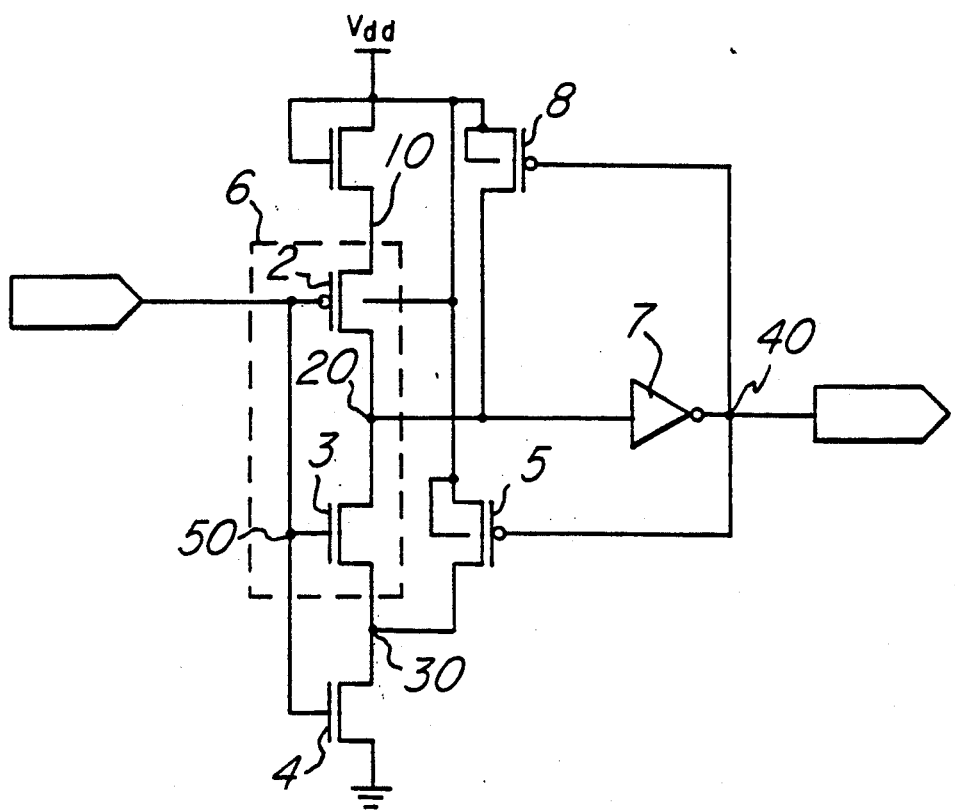
FIG. 8 is an electrical schematic diagram of an alternative embodiment of the invention illustrating the addition of a pull-up transistor 8 to the embodiment of FIG. 7.

FIG. 8 is an electrical schematic diagram illustrating an alternative embodiment of the invention wherein FIG. 7 is modified by the addition of a p-channel pull-up transistor 8. P-channel pull-up transistor 8 has its gate connected to node 40 and its source/drain path connected between node 20 and Vdd. In this embodiment, p-channel pull-up transistor 8 is a narrow width-/long channel (small) transistor so that its impedance is large when it is on. (P-channel pull-up transistor 8 is on when output signal Vout drops "low" corresponding to input signal Vin dropping "low".) P-channel pull-up transistor 8 provides feedback from node 40 to node 20 that helps turn the p-channel transistor, not shown, of inverter 7 off by pulling the voltage at node 20 to Vdd. This helps bring Idd of FIG. 4 closer to zero between times t0 and t1 when input signal Vin is "low".

Figure 9:
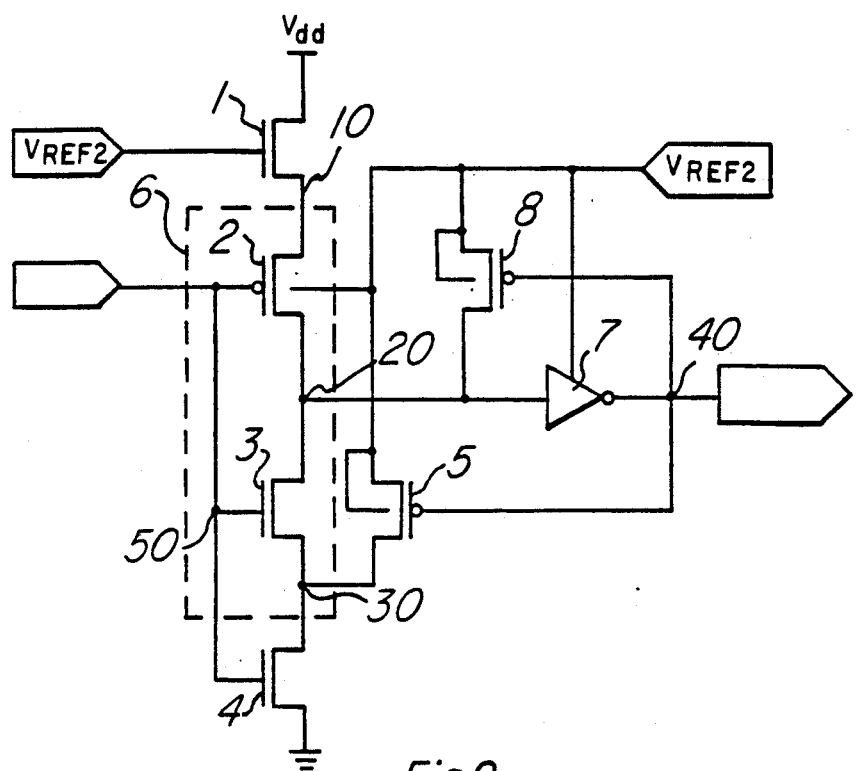
FIG. 9 is an electrical schematic diagram of an alternative embodiment of the invention illustrating the addition of an additional reference voltage to bias node 20 and the p-channel transistor of inverter 7.

FIG. 9 is an electrical schematic diagram illustrating an alternative embodiment of the invention wherein FIG. 1 is modified by the addition of a p-channel pull-up transistor 8 and a second reference voltage Vref2. In this embodiment, the source and substrate of p-channel transistor 5 and the substrate of p-channel transistor 2 are not connected to node 10, rather, they are connected to Vref2. Vref2 is a stable reference voltage source. It may be generated, for instance, by a bandgap generator circuit located on the DRAM chip. Vref 2 in this example has a value of 4.0 v. Vref1 has a value of 3.3 v as earlier described. P-channel pull-up transistor 8 has its gate connected to node 40 and its source/drain path connected between Vref2 and node 20. The substrate of p-channel transistor 8 is also connected to Vref2. This embodiment will also function in the case wherein Vref2 is lower than Vref1.

The embodiment illustrated in FIG. 9 is advantageous in situations where stable reference voltage sources are available. As illustrated in FIG. 4, between time t0 and t1, when input signal Vin is low, the circuit of FIG. 1 draws a small amount of Idd. This occurs because the voltage at node 20 is not quite large enough to completely turn off the p-channel transistor, not shown, of inverter 7. Vref 2 supplies enough voltage to turn the p-channel transistor, not shown, of inverter 7 off during the time when input signal Vin is low. This brings Idd closer to zero and further reduces the power drawn by the circuit.

Figure 10:
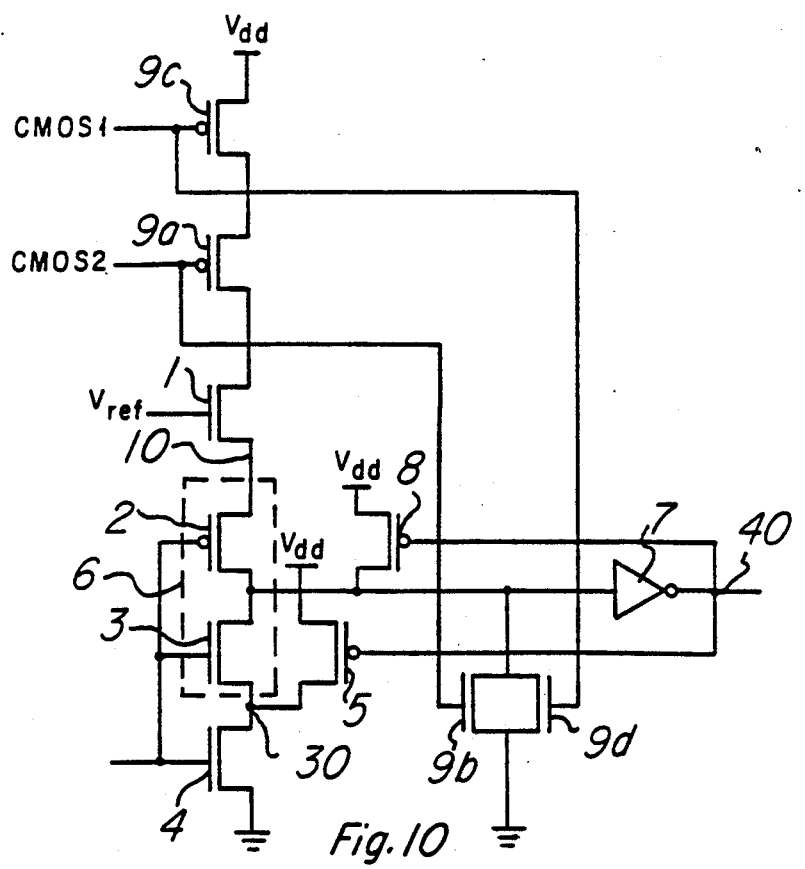
FIG. 10 is an electrical schematic diagram of an alternative embodiment of the invention illustrating its incorporation into a dual input clocked NOR logic gate.

The invention may be used in the design of logic gates. FIG. 10 is an electrical schematic of a dual input clocked NOR gate. The embodiment disclosed in FIG. 1 is modified as follows: The source of p-channel transistor is disconnected from node 10 and is connected to Vdd. A p-channel pull-up transistor 8 is added having its gate connected to node 40 and its source/drain path connected between Vdd and node 20. P-channel transistors 9a and 9c, connected in series, are added having their source/drain paths connected between Vdd and the drain of n-channel transistor 1. N-channel transistors 9b and 9d, are connected in parallel between node 20 and ground. Input signal CMOS1 is connected to the gate of p-channel transistor 9c and n-channel transistor 9d. Input signal CMOS2 is connected to the gate of p-channel transistor 9a and n-channel transistor 9b. The circuit operates as a NOR logic gate that is clocked by input signal Vin. Output signal Vout is responsive to input signal Vin when both input signals CMOS1 and CMOS2 are low.

Figure 11:
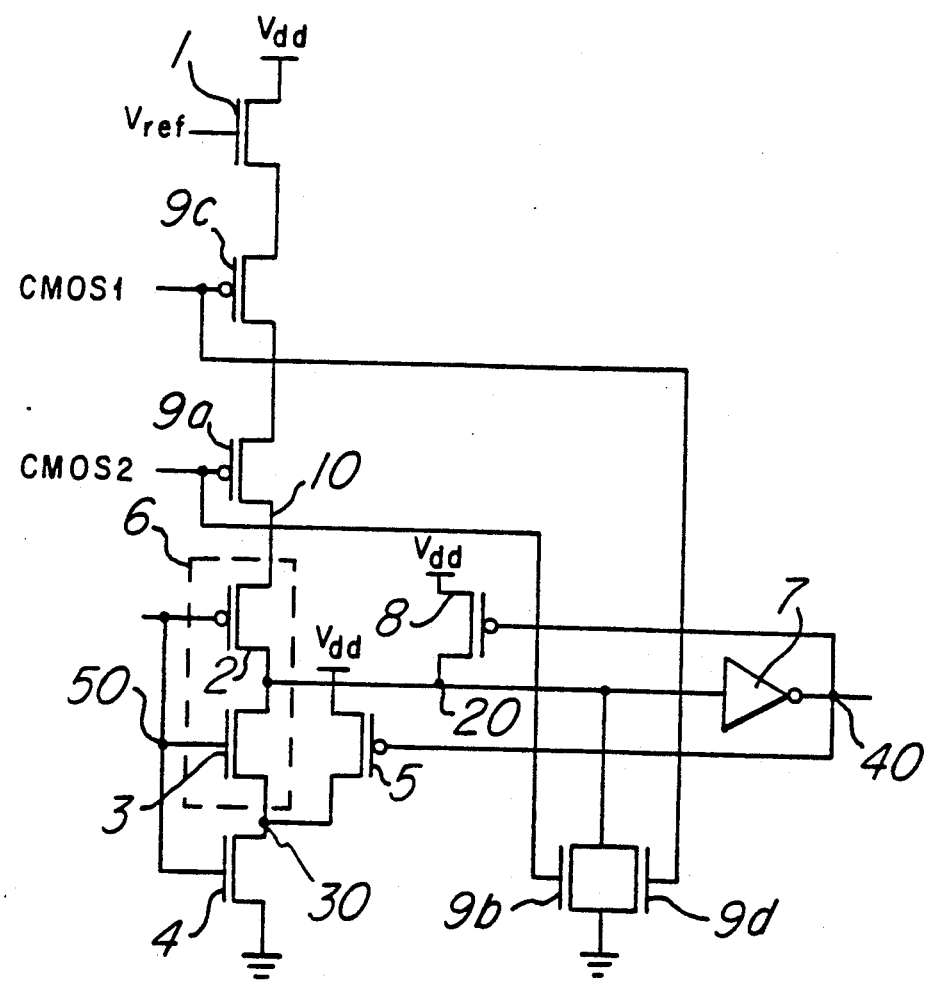
FIG. 11 is an electrical schematic diagram of an alternative embodiment of the invention illustrating its incorporation into a dula input clocked NOR logic gate.

FIG. 11 is an electrical schematic diagram of a dual input clocked NOR gate also. FIG. 10 is modified as follows: N-channel pull-up transistor 1 now has its drain connected to Vdd and p-channel transistors 9a and 9c, connected in series, now have their source/drain paths connected beween the source of n-channel pull-up transistor 1 and the series source/drain path of p-channel transistor 2 and n-channel transistor 3. This circuit also operates as a NOR logic gate that is clocked by input signal Vin.

Figure 12:
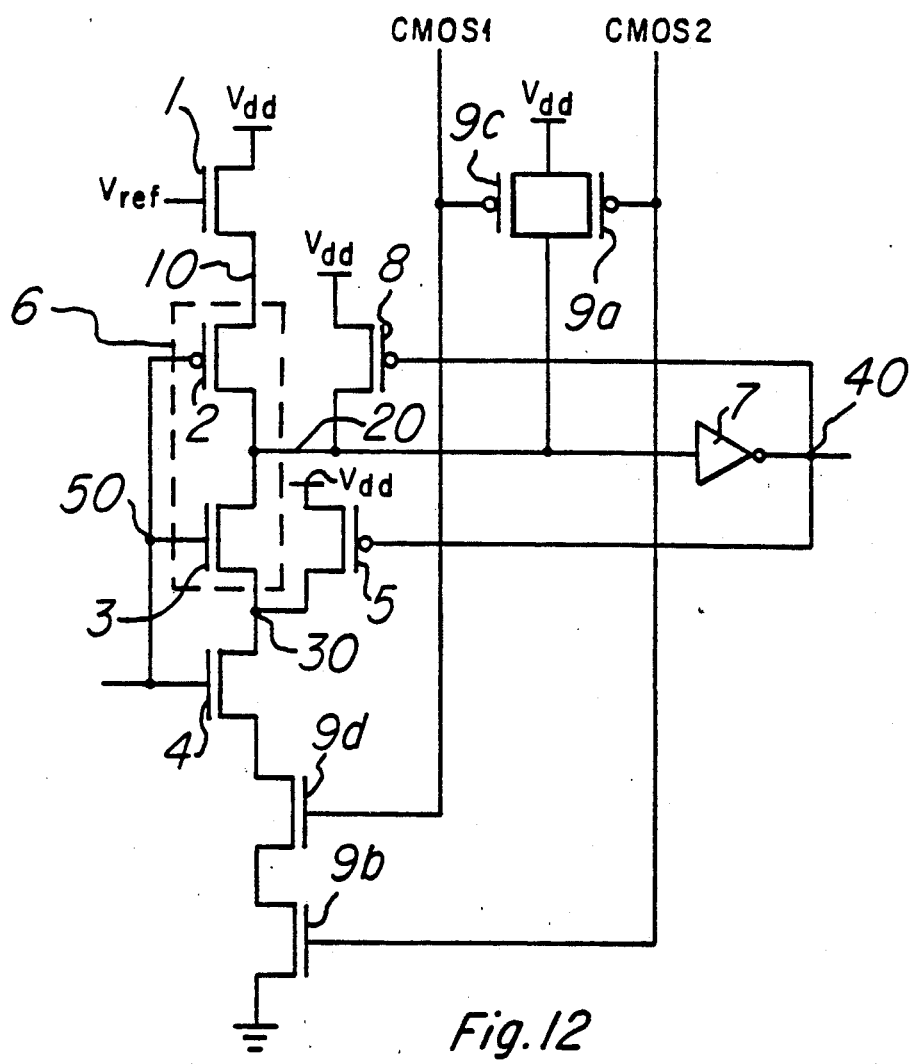
FIG. 12 is an electrical schematic diagram of an alternative embodiment of the invention illustrating its incorporation into a dual input clocked NAND logic gate.

FIG. 12 is an electrical schematic diagram of a dual input clocked NAND gate. The embodiment disclosed in FIG. 1 is modified as follows: The source of p-channel transistor 5 is disconnected from node 10 and is connected to Vdd. A p-channel pull-up transistor 8 is added having its gate connected to node 40 and its source/drain path connected between Vdd and node 20. P-channeltransistor 9a receives input signal CMOS2 on its gate. P-channel transistor 9c receives input signal CMOS1 on its gate. P-channel transistors 9a and 9c are connected in parallel between Vdd and node 20. N-channel transistor 9d receives input signal CMOS1 on its gate. N-channel transistor 9b receives input signal CMOS2 on its gate. N-channel transistors 9d and 9b are connected in series between ths source of n-channel transistor 4 and ground. The circuit functions as a NAND gate. Output signal Vout is responsive to input signal Vin when input signals CMOS1 and CMOS2 are high.

Figure 13:
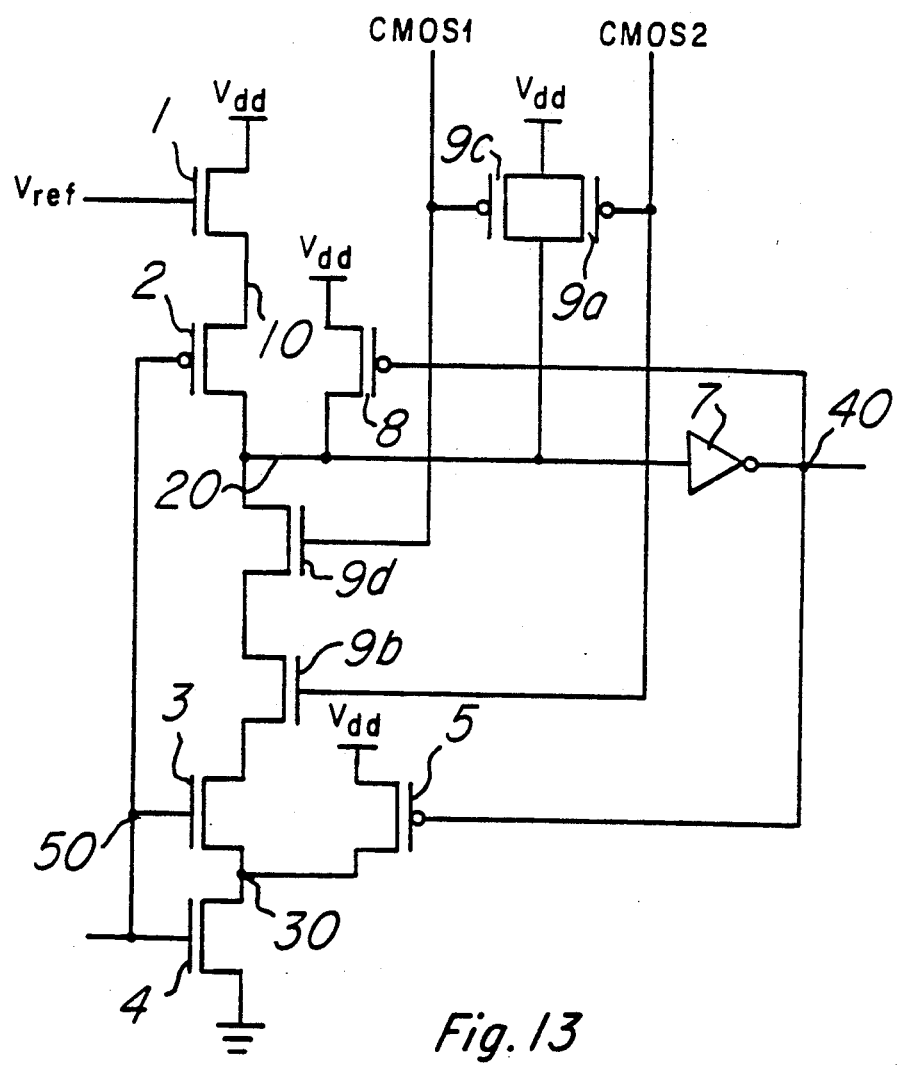
FIG. 13 is an electrical schematic diagram of an alternative embodiment of the invention illustrating its incorporation into a dual input clocked NAND logic gate.

FIG. 13 is also an electrical schematic diagram of a dual input clocked NAND gate. The embodiment disclosed in FIG. 1 is modified as follows: The source of p-channel transistor 5 is disconnected from node 10 and is connected to Vdd. A p-channel pull-up transistor 8 is added having its gate connected to node 40 and its source/drain path connected between Vdd and node 20. P-channel transistor 9a receives input signal CMOS2 on its gate. P-channel transistor 9c receives input signal CMOS1 on its gate. P-channel transistors 9a and 9c are connected in parallel between Vdd and node 20. N-channel transistor 9d receives input signal CMOS1 on its gate. N-channel transistor 9b receives input signal CMOS2 on its gate. N-channel transistors 9b and 9d are connected in series between the series connection of p-channel transistor 2 and n-channel transistor 3. The circuit functions as a NAND gate. Output signal Vout is responsive to input signal Vin when input signals CMOS1 and CMOS2 are high.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. An input circuit comprising:
   a first transistor of a first conductivity type having its source connected to a first reference voltage, its gate connected to an input signal, and having a drain;
   second and third transistors of an opposite conductivity type having their source/drain paths connected in series between the drain of said first transistor and a common potential, and having their gates connected to the input signal;
   an invertor having its input connected to the drain of said first transistor, and having an output;
   a fourth transistor of said first conductivity type having its gate connected to the output, its drain connected to the series connection between said second and third transistors, and having its source connected to a second reference voltage; and
   wherein the second reference voltage is higher than the first reference voltage.

2. An input circuit comprising:
   a first transistor of a first conductivity type having its source connected to a first reference voltage, its gate connected to an input signal, and having a drain;
   second and third transistors of an opposite conductivity type having their source/drain paths connected in series between the drain of said first transistor and a common potential, and having their gates connected to the input signal;
   an invertor having its input connected to the drain of said first transistor, and having an output;
   a fourth transistor of said first conductivity type having its gate connected to the output, its drain conond and third transistors, and having its source connected to a second reference voltage; and wherein the second reference voltage is lower than the first reference voltage.

3. An input circuit comprising:
a first transistor of a first conductivity type having its source connected to a first reference voltage, its gate connected to an input signal, and having a drain;
second and third transistors of an opposite conductivity type having their source/drain paths connected in series between the drain of said first transistor and a common potential, and having their gates connected to the input signal;
an invertor having its input connected to the drain of said first transistor, and having an output;
a fourth transistor of said first conductivity type having its gate connected to the output, its drain connected to the series connection between said second and third transistors, and having its source connected to a second reference voltage; and
a first pull-up transistor of the opposite conductivity type having its drain connected to a voltage supply, its gate connected to a voltage reference generator circuit and its source connected to the source of the first transistor.

4. The circuit of claim 3 further comprising:
a second pull-up transistor of the first conductivity type having its source connected to the voltage supply, its drain connected to the input of the inverter, and its gate connected to the output.

5. The circuit of claim 4 further comprising:
logic circuitry having a logic input and coupled to the input of the inverter in such a manner that the inverter is also responsive to the state of the logic input of the logic circuitry.

6. The circuit of claim 5 wherein said logic circuitry comprises:
a first logic transistor of the first conductivity type having its gate connected to the logic input, and its source/drain path connected in series between the voltage supply and the input of the inverter; and
a second logic transistor of the second conductivity type having its gate connected to the logic input, and its source/drain path connected in series between the drain of the first transistor and the common potential.

7. The circuit of claim 5 wherein said logic circuitry comprises:
a first logic transistor of the first conductivity type having its gate connected to the logic input, and its source/drain path connected in series between the voltage supply and the drain of the first pull-up transistor; and
a second logic transistor of the second conductivity type having its gate connected to the logic input, and its source/drain path connected in series between the input of the inverter and the common potential.

8. The circuit of claim 5 wherein said logic circuitry comprises:
a first logic transistor of the first conductivity type having its gate connected to the logic input, and its source/drain path connected in series between the source of the first pull-up transistor and the source of the first transistor; and
a second logic transistor of the second conductivity type having its gate connected to the logic input, and its source/drain path connected in series between the input of the inverter and the common potential.

9. The circuit of claim 3 further comprising:
a second pull-up transistor of the first conductivity type having its source connected to the second reference voltage, its drain connected to the input of the inverter, and having its gate connected to the output.

10. The circuit of claim 3 wherein the first transistor and the fourth transistor are p-channel MOS transistors and the second transistor, third transistor, and the pull-up transistor are n-channel MOS transistors.

11. An input circuit comprising:
a first transistor of a first conductivity type having its source connected to a first reference voltage, its gate connected to an input signal, and having a drain;
second and third transistors of an opposite conductivity type having their source/drain paths connected in series between the drain of said first transistor and a common potential, and having their gates connected to the input signal;
an invertor having its input connected to the drain of said first transistor, and having an output;
a fourth transistor of said first conductivity type having its gate connected to the output, its drain connected to the series connection between said second and third transistors, and having its source connected to a second reference voltage; and
a first pull-up transistor of the opposite conductivity type having its drain and gate connected to a voltage supply, and its source connected to the source of the first transistor.

12. The circuit of claim 11 further comprising:
a second pull-up transistor of the first conductivity type having its source connected to the voltage supply, its drain connected to the input of the inverter, and its gate connected to the output.

13. The circuit of claim 11 further comprising:
a second pull-up transistor of the first conductivity type having its source connected to the second reference voltage, its drain connected to the input of the inverter, and its gate connected to the output.

14. The circuit of claim 11 wherein the first transistor and the fourth transistor are p-channel MOS transistors and the second transistor, third transistor, and the pull-up transistor are n-channel MOS transistors.

15. An input circuit comprising:
a pull-up transistor having its source/drain path connected in series between a first reference voltage and an intermediate output node, and having its gate connected to an input signal, its source/drain path being conductive responsive to the input signal being at a first logic stage;
a first and a second pull-down transistors having their source/drain paths connected in series between the intermediate output node and a common potential, and having their gates connected to the input signal, their source/drain path being conductive responsive to the input signal being at a second logic state;
an invertor having its input connected to the intermediate output node, to produce an output signal;
a feedback transistor having its gate connected to the output signal, and its source/drain path connected in series between a second reference voltage and the series connection between the first and second pull-down transistors, its source/drain path being conductive responsive to the logic state of the output signal; and wherein the first reference voltage and the second reference voltage are the same.

16. An input circuit comprising:

a pull-up transistor having its source/drain path connected in series between a first reference voltage and an intermediate output node, and having its gate connected to an input signal, its source/drain path being conductive responsive to the input signal being at a first logic stage;

a first and a second pull-down transistors having their source/drain paths connected in series between the intermediate output node and a common potential, and having their gates connected to the input signal, their source/drain path being conductive responsive to the input signal being at a second logic state;

an invertor having its input connected to the intermediate output node, to produce an output signal;

a feedback transistor having its gate connected to the output signal, and its source/drain path connected in series between a second reference voltage and the series connection between the first and second pull-down transistors, its source/drain path being conductive responsive to the logic state of the output signal; and wherein the second reference voltage is lower than the first reference voltage.

17. An input circuit comprising:

a pull-up transistor having its source/drain path connected in series between a first reference voltage and an intermediate output node, and having its gate connected to an input signal, its source/drain path being conductive responsive to the input signal being at a first logic stage;

a first and a second pull-down transistors having their source/drain paths connected in series between the intermediate output node and a common potential, and having their gates connected to the input signal, their source/drain path being conductive responsive to the input signal being at a second logic state;

an invertor having its input connected to the intermediate output node, to produce an output signal;

a feedback transistor having its gate connected to the output signal, and its source/drain path connected in series between a second reference voltage and the series connection between the first and second pull-down transistors, its source/drain path being conductive responsive to the logic state of the output signal; and a second pull-up transistor having its source/drain path connected in series between a voltage supply and the source/drain path of the pull-up transistor, and having its gate connected to a voltage reference generator circuit, its source/drain path being always conductive.

18. The circuit of claim 17 further comprising:

a third pull-up transistor having its source/drain path connected between the voltage supply and the input of the inverter, and having its gate connected to the output.

19. The circuit of claim 17 further comprising:

a third pull-up transistor having its source/drain path connected between the second reference voltage and the input of the inverter, and having its gate connected to the output.

20. An input circuit comprising:

a pull-up transistor having its source/drain path connected in series between a first reference voltage and an intermediate output node, and having its gate connected to an input signal, its source/drain path being conductive responsive to the input signal being at a first logic stage;

a first and a second pull-down transistors having their source/drain paths connected in series between the intermediate output node and a common potential, and having their gates connected to the input signal, their source/drain path being conductive responsive to the input signal being at a second logic state;

an invertor having its input connected to the intermediate output node, to produce an output signal;

a feedback transistor having its gate connected to the output signal, and its source/drain path connected in series between a second reference voltage and the series connection between the first and second pull-down transistors, its source/drain path being conductive responsive to the logic state of the output signal; and a second pull-up transistor having its source/drain path connected in series between a voltage supply and the source/drain path of the pull-up transistor, and having its gate connected to the voltage supply, its source/drain path always being conductive.

21. The circuit of claim 20 further comprising:

a third pull-up transistor having its source/drain path connected between the voltage supply and the input of the inverter, and having its gate connected to the output.

22. The circuit of claim 20 further comprising:

a third pull-up transistor having its source/drain path connected between the second reference voltage and the input of the inverter, and having its gate connected to the output.

23. A CMOS input buffer comprising:

a pull-up transistor having its source/drain path connected in series between a voltage supply and a first reference voltage, and having its gate connected to a reference voltage generator circuit;

a CMOS inverter having the source/drain paths of its p-channel transistor and its n-channel transistor connected in series between the first reference voltage and a node, and having the gates of its p-channel transistor and its n-channel transistor connected to the input signal;

a pull-down transistor having its source/drain path connected in series between a common potential and the node;

an inverter having its input connected to the source/drain path of the CMOS inverter, and having an output;

a feedback transistor having its gate connected to the output, and its source/drain path connected in series between a second reference voltage and the node; and wherein the relative sizes of the p-channel transistor and the n-channel transistor of the CMOS inverter, and the pull-down transistor and the feedback transistor cause the CMOS inverter to have a low level trip point and a high level trip point.

24. The CMOS input buffer of claim 23 wherein the first reference voltage and the second reference voltage are the same.

25. The CMOS input buffer of claim 23 wherein the second reference voltage is higher than the first reference voltage.

26. The CMOS input buffer of claim 23 wherein the second reference voltage is lower than the first reference voltage.

27. The CMOS input buffer of claim 23 further comprising:

a second pull-up transistor having its source/drain path connected in series between the voltage supply and the input of the inverter and having its gate connected to the output.

28. The CMOS input buffer of claim 23 further comprising:

a second pull-up transistor having its source/drain path connected in series between the second reference voltage and the input of the inverter and having its gate connected to the input.

* * * * *